(12) United States Patent
Kim (10) Patent No.: US 11,485,879 B2
(45) Date of Patent: Nov. 1, 2022

(54) HIGH-DIELECTRIC ADHESIVE FILM

(71) Applicant: ICH CO., LTD., Gunpo-si (KR)

(72) Inventor: Young Hun Kim, Ansan-si (KR)

(73) Assignee: ICH Co., Ltd., Gunpo-Si (KR)

( * ) Notice: Subject to any disclaimer, the term of this patent is extended or adjusted under 35 U.S.C. 154(b) by 1045 days.

(21) Appl. No.: 16/167,690

(22) Filed: Oct. 23, 2018

(65) Prior Publication Data

US 2020/0071570 A1    Mar. 5, 2020

(30) Foreign Application Priority Data

Aug. 31, 2018  (KR) .................. 10-2018-0103731

(51) Int. Cl.
| | | |
|---|---|---|
| *C09J 7/29* | (2018.01) | |
| *C09J 7/38* | (2018.01) | |
| *C09J 9/00* | (2006.01) | |
| *H01L 23/373* | (2006.01) | |
| *H01L 23/00* | (2006.01) | |

(52) U.S. Cl.
CPC ............. *C09J 7/29* (2018.01); *C09J 7/385* (2018.01); *C09J 9/00* (2013.01); *H01L 23/3735* (2013.01); *C09J 2203/326* (2013.01); *C09J 2400/123* (2013.01); *C09J 2433/00* (2013.01); *C09J 2479/086* (2013.01); *C09J 2483/006* (2013.01); *H01L 24/29* (2013.01); *H01L 2224/2919* (2013.01); *H01L 2224/29083* (2013.01); *H01L 2224/29287* (2013.01); *H01L 2224/29391* (2013.01)

(58) Field of Classification Search
CPC ....... C09J 7/29; C09J 7/385; C09J 9/00; C09J 2203/326; C09J 2479/086; C09J 2483/006; C09J 2400/13; H01L 23/3735; H01L 24/29; H01L 2224/29083; H01L 2224/2919; H01L 224/29287; H01L 2224/29391
See application file for complete search history.

(56) References Cited

U.S. PATENT DOCUMENTS

| | | | | |
|---|---|---|---|---|
| 5,755,909 A | * | 5/1998 | Gailus ................ | H01L 41/29 29/25.35 |
| 2009/0278034 A1 | * | 11/2009 | Ackermann .......... | H01L 25/167 250/227.11 |

FOREIGN PATENT DOCUMENTS

| | | |
|---|---|---|
| KR | 19990029156 A | 4/1999 |
| KR | 10-2000-0035259 A | 6/2000 |
| KR | 20040053574 A | 6/2004 |
| KR | 10-0528435 B1 | 11/2005 |
| KR | 2009-0009499 A | 1/2009 |
| KR | 10-0956432 B1 | 5/2010 |
| KR | 10-1440276 B1 | 9/2014 |
| KR | 2016-0059059 A | 5/2016 |
| KR | 10-1679336 B1 | 11/2016 |
| KR | 20170023982 A | 3/2017 |
| KR | 20170142765 A | 12/2017 |

OTHER PUBLICATIONS

Office Action issued in corresponding Korean Application No. 10-2018-0103731 dated Jan. 18, 2019.
Decision to Grant a Patent issued in corresponding Korean Application No. 10-2018-0103731 dated May 16, 2019.

* cited by examiner

*Primary Examiner* — Robert D Harlan
(74) *Attorney, Agent, or Firm* — Harness, Dickey & Pierce, P.L.C.

(57) ABSTRACT

Disclosed is a high-dielectric adhesive film, particularly a high-dielectric adhesive film including a substrate layer, a ceramic-mixed layer formed on one surface of the substrate layer and an adhesive layer formed on the surface of the substrate layer on which the ceramic-mixed layer is formed. The high-dielectric adhesive film thus configured is improved in permittivity due to the use of a ceramic component, thus preventing the malfunction of electronic devices, increasing the stability and performance thereof, and exhibiting heat dissipation effects.

3 Claims, 9 Drawing Sheets

| Classification | 1 min | 30 min |
|---|---|---|
| Example 1 | 1(34.4) 2(31.2) 3(29.5) 4(28.8) 5(28.9) | 1(35.5) 2(32.1) 3(30.2) 4(29.5) 5(29.4) |
| Comparative Example 1 | 1(34.9) 2(31.9) 3(30.3) 4(29.5) 5(29.4) | 1(33.6) 2(31.1) 3(29.7) 4(29.2) 5(28.9) |

HIGH-DIELECTRIC ADHESIVE FILM

CROSS-REFERENCE TO RELATED APPLICATION

The present application claims priority to Korean Patent Application No. 10-2018-0103731, filed Aug. 31, 2018, the entire contents of which is incorporated herein for all purposes by this reference.

FIELD

The present disclosure relates to a high-dielectric adhesive film, and more particularly to a high-dielectric adhesive film, the permittivity of which is improved due to the use of a ceramic component, thus preventing malfunction of electronic devices, increasing the stability and performance thereof, and exhibiting heat dissipation effects.

BACKGROUND

Polyimide, typically having high mechanical strength, heat resistance, insulating properties, solvent resistance, etc., is widely used as a protective material or an insulating material for a liquid crystal display or a semiconductor, and as an electronic material for a color filter. In recent years, polyimide is also expected to be useful as a material for optical communication, such as a material for optical waveguides, etc., or as a substrate for mobile phones.

These days, small-sized electronic devices including IT devices are being rapidly developed, and the materials used therefor are also required to have advanced characteristics. Conventionally, great effort has been put into improving the performance of parts by efficiently storing electrical energy generated from IT devices by applying a film, formed by coating one side of a polyimide with an adhesive, to a small-sized IT device such as a mobile phone.

Specifically, attempts have been made to develop materials having not only excellent heat resistance and solvent resistance but also many performance characteristics suitable for the end use thereof. However, conventional cases in which a polyimide film is applied through coating with an adhesive are problematic in that electrical energy generated from the IT device cannot be efficiently stored owing to the low permittivity of polyimide.

Moreover, the conventional polyimide film has low heat conductivity and cannot perform the function of dissipating heat generated from the IT device, which is undesirable.

SUMMARY

Accordingly, the present disclosure is intended to provide a high-dielectric adhesive film, the permittivity of which is improved due to the use of a ceramic component, thus preventing the malfunction of electronic devices, increasing the stability and performance thereof, and exhibiting heat dissipation effect.

An embodiment of the present disclosure provides a high-dielectric adhesive film, comprising: a substrate layer, a ceramic-mixed layer formed on one or both surfaces of the substrate layer, and an adhesive layer formed on the surface of the substrate layer on which the ceramic-mixed layer is formed.

Preferably, an adhesive layer is further formed on the surface of the substrate layer opposite the surface on which the ceramic-mixed layer is formed.

More preferably, the substrate layer comprises polyimide.

Even more preferably, the substrate layer is formed to a thickness of 6 to 100 µm.

Even more preferably, the ceramic-mixed layer comprises 100 parts by weight of a ceramic and 50 to 200 parts by weight of silicone.

Even more preferably, the ceramic comprises at least one selected from the group consisting of aluminum oxide, silicon carbide, silicon nitride, zirconium oxide, barium titanate, chromium oxide and titanium dioxide.

Even more preferably, the ceramic-mixed layer is formed to a thickness of 3 to 50 µm.

Even more preferably, the adhesive layer is formed to a thickness of 5 to 100 µm.

Another embodiment of the present disclosure provides a high-dielectric adhesive film, comprising: a substrate layer and a ceramic adhesive layer formed on one surface of the substrate layer.

Preferably, the ceramic adhesive layer comprises a pressure-sensitive adhesive, a ceramic and silicone.

According to the present disclosure, the high-dielectric adhesive film is improved in permittivity due to the use of a ceramic component, thus preventing the malfunction of electronic devices, increasing the stability and performance thereof, and exhibiting heat dissipation effects.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Hereinafter, a detailed description will be given of preferred embodiments of the present invention and the properties of individual components, which are merely set forth to explain the present invention such that the invention may be easily performed by those skilled in the art, but are not construed as limiting the spirit and scope of the present invention.

The disclosed high-dielectric adhesive film comprises a substrate layer 10, a ceramic-mixed layer 20 formed on one or both surfaces of the substrate layer 10, and an adhesive layer 30 formed on the surface of the substrate layer 10 on which the ceramic-mixed layer 20 is formed.

The substrate layer 10 is a layer that is responsible for a substrate for the disclosed high-dielectric adhesive film. The substrate layer 10 has a thickness of 6 to 100 μm, and functions to prevent the disclosed high-dielectric adhesive film from being broken or deformed by external force.

Here, various examples of the substrate layer 10 may include polyimide, polyethylene, polyethylene terephthalate, polypropylene, fiber and nonwoven fabric. Taking into consideration the heat resistance or chemical resistance of the adhesive film, the substrate layer 10 is preferably composed of polyimide.

If the thickness of the substrate layer 10 is less than 6 μm, the high-dielectric adhesive film may be easily broken or deformed by external force. On the other hand, if the thickness of the substrate layer 10 exceeds 100 μm, the adhesive film may become excessively thick, thus being unsuitable for use in electronic devices to be miniaturized and thinned.

The ceramic-mixed layer 20 is formed to a thickness of 3 to 50 μm on one or both surfaces of the substrate layer 10, and is composed of 100 parts by weight of a ceramic and 50 to 200 parts by weight of silicone. The ceramic-mixed layer 20 functions to improve permittivity so that the electrical energy generated from the disclosed high-dielectric adhesive film is efficiently stored to thus increase the performance of parts.

When the ceramic-mixed layer 20 is formed in this way, it is easy to control the thickness of each structure depending on the application position, making it possible to manufacture products having various thicknesses, compared to when polyimide is used alone. Furthermore, it is possible to produce a film having a threshold thickness, ultimately improving permittivity.

If the thickness of the ceramic-mixed layer 20 is less than 3 μm, the above effects are insignificant. On the other hand, if the thickness of the ceramic-mixed layer 20 exceeds 50 μm, the above effects are not greatly improved, and the adhesive film may become excessively thick, thus being unsuitable for use in electronic devices to be miniaturized and thinned.

Here, the ceramic is preferably composed of at least one component selected from the group consisting of aluminum oxide, silicon carbide, silicon nitride, zirconium oxide, barium titanate, chromium oxide and titanium dioxide. The ceramic composed of the above component plays a role in imparting the ceramic-mixed layer with permittivity and heat dissipation performance.

The silicone functions as a binder for binding the ceramic, and moreover functions to provide a high-dielectric adhesive film having high heat resistance by virtue of the superior heat resistance thereof. If the amount of silicone is less than 50 parts by weight based on 100 parts by weight of the ceramic composed of the above component, the impact resistance or heat resistance of the ceramic-mixed layer may deteriorate. On the other hand, if the amount of silicone exceeds 200 parts by weight based on 100 parts by weight of the ceramic, the amount of silicone relative to that of the ceramic is excessively high, and thus the improvement in the permittivity and heat dissipation performance of the adhesive film becomes insignificant.

The adhesive layer 30 may be formed on one surface of the substrate layer 10 on which the ceramic-mixed layer 20 is formed or may be formed on both surfaces of the substrate layer 10 on which the ceramic-mixed layer 20 is formed. The adhesive layer 30 is formed to a thickness of 5 to 100 μm, and functions to attach the disclosed high-dielectric adhesive film to an electronic device.

The adhesive layer 30 is preferably composed of any one pressure-sensitive adhesive selected from the group consisting of acrylic, silicone-, epoxy-, phenol-, rubber- and urethane-based pressure-sensitive adhesives. Taking into consideration the properties of the adhesive film, such as adhesiveness and chemical resistance, an acrylic pressure-sensitive adhesive is preferably used.

If the thickness of the adhesive layer 30 is less than 5 μm, adhesion of the disclosed high-dielectric adhesive film may be excessively decreased and the high-dielectric adhesive film may easily become detached from the attachment target. On the other hand, if the thickness of the adhesive layer 30 exceeds 100 μm, adhesion of the disclosed high-dielectric adhesive film is not greatly enhanced and the adhesive film may become excessively thick, thus being unsuitable for use in electronic devices to be miniaturized and thinned.

In addition, the disclosed high-dielectric adhesive film may comprise a substrate layer 10 and a ceramic adhesive layer 40 formed on one surface of the substrate layer 10, and the ceramic adhesive layer 40 is composed of a pressure-sensitive adhesive, a ceramic and silicone, and preferably comprises 100 parts by weight of a pressure-sensitive adhesive, 80 to 120 parts by weight of a ceramic and 50 to 200 parts by weight of silicone.

When the ceramic adhesive layer 40 is formed in this way, the ceramic-mixed layer 20 and the adhesive layer 30 may be provided in the form of a single layer, without distinction therebetween, thus simplifying the process of manufacturing the high-dielectric adhesive film.

Here, the thickness and material of the substrate layer 10 and the specific components and critical numerical limits of the pressure-sensitive adhesive, ceramic and silicone for the ceramic adhesive layer 40 remain the same as in the above description, and thus a description thereof is omitted.

A better understanding of the method of manufacturing the disclosed high-dielectric adhesive film and the properties of the high-dielectric adhesive film manufactured by the above method will be given through the following examples.

Example 1

A high-dielectric adhesive film having a total thickness of 50 μm was manufactured in a manner in which a substrate layer comprising polyimide was formed to a thickness of 20 μm, a ceramic-mixed layer comprising 100 parts by weight of a ceramic (silicon carbide) and 125 parts by weight of silicone was formed to a thickness of 10 μm on the upper surface of the substrate layer, and an adhesive layer comprising an acrylic pressure-sensitive adhesive was formed to a thickness of 20 μm on the upper surface of the ceramic-mixed layer.

Comparative Example 1

An adhesive film having a total thickness of 50 μm was manufactured in a manner in which a substrate layer comprising polyimide was formed to a thickness of 30 μm, and an adhesive layer comprising an acrylic pressure-sensitive adhesive was formed to a thickness of 20 μm on one surface of the substrate layer.

Figure 1:
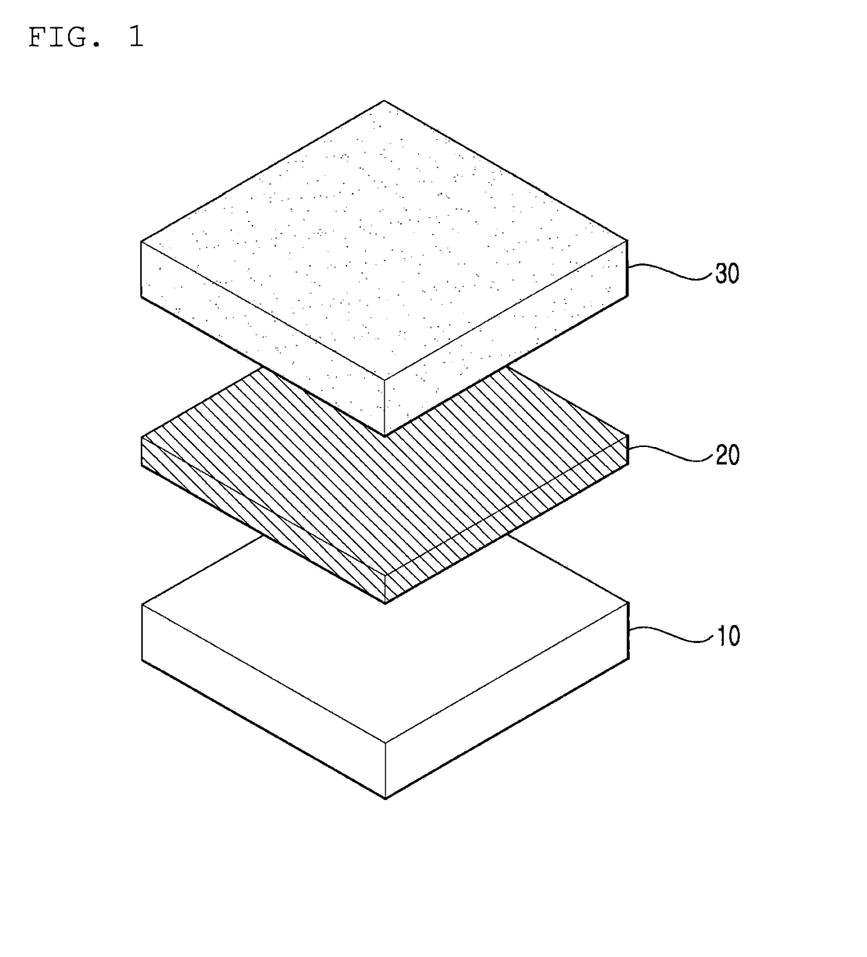
FIG. 1 is an exploded perspective view showing a high-dielectric adhesive film according to an embodiment of the present disclosure.
Figure 2:
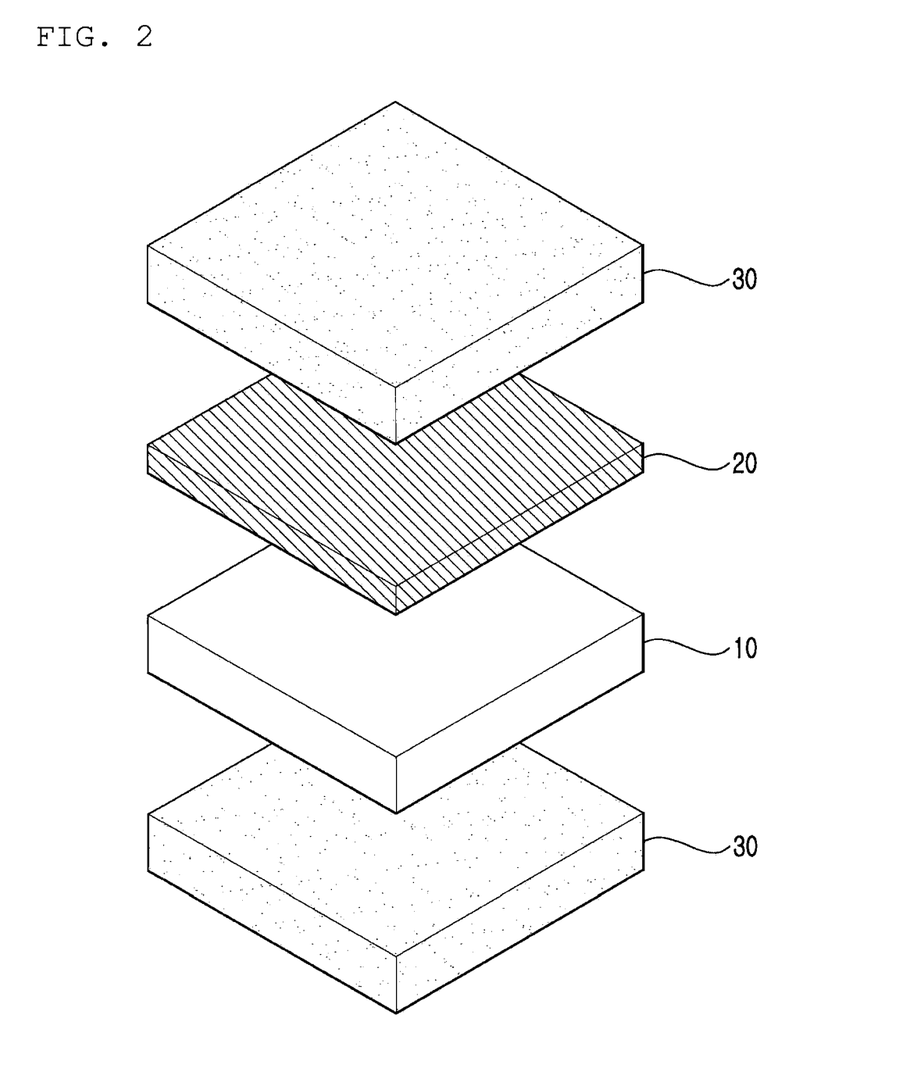
FIG. 2 is an exploded perspective view showing a high-dielectric adhesive film according to another embodiment of the present disclosure.
Figure 3:
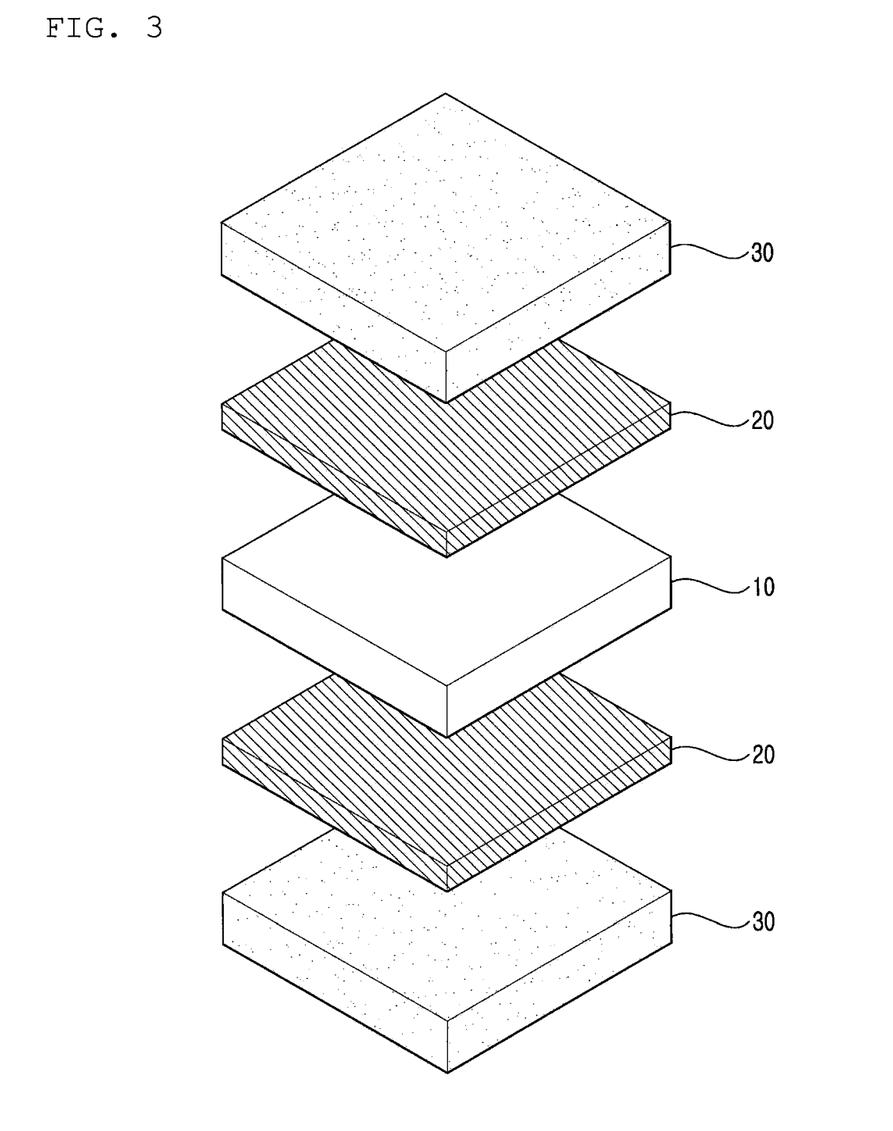
FIG. 3 is an exploded perspective view showing a high-dielectric adhesive film according to still another embodiment of the present disclosure.
Figure 4:
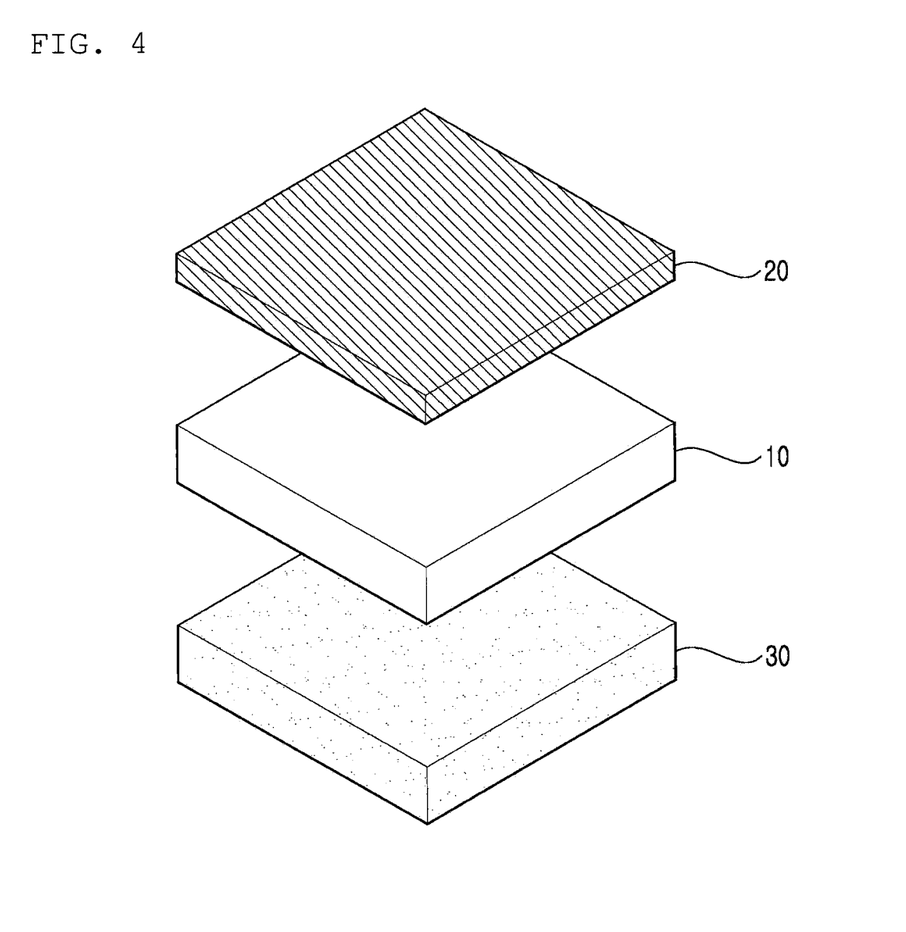
FIG. 4 is an exploded perspective view showing a high-dielectric adhesive film according to yet another embodiment of the present disclosure.
Figure 5:
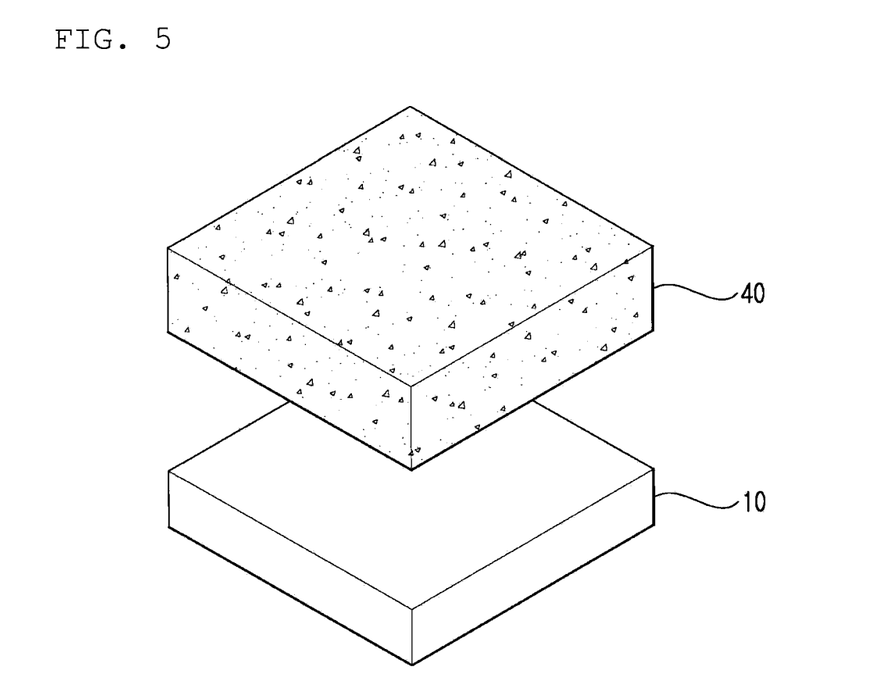
FIG. 5 is an exploded perspective view showing a high-dielectric adhesive film according to even another embodiment of the present disclosure.
Figure 6:
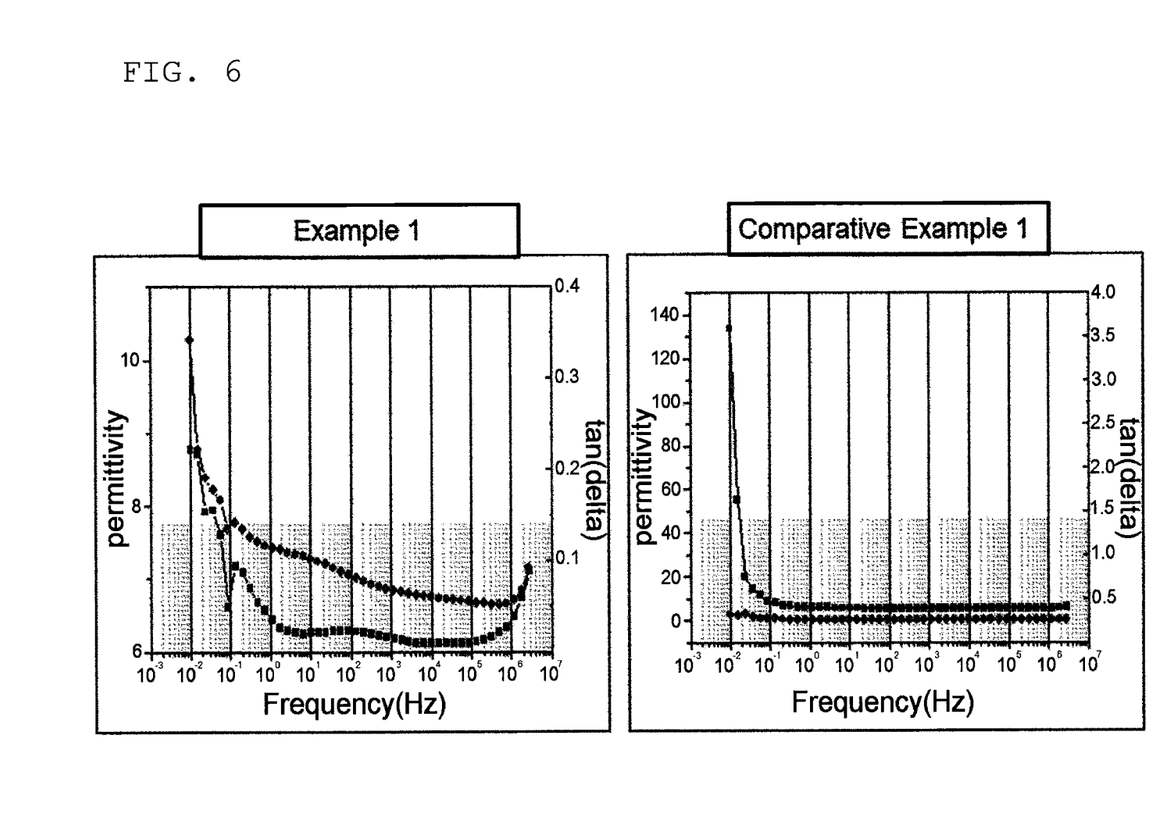
FIG. 6 is graphs showing the results of measurement of permittivity of the adhesive films manufactured in Example 1 and Comparative Example 1.

The permittivity of the adhesive films manufactured in Example 1 and Comparative Example 1 was measured. The results are shown in Table 1 below and in FIG. 6.

Figure 7:
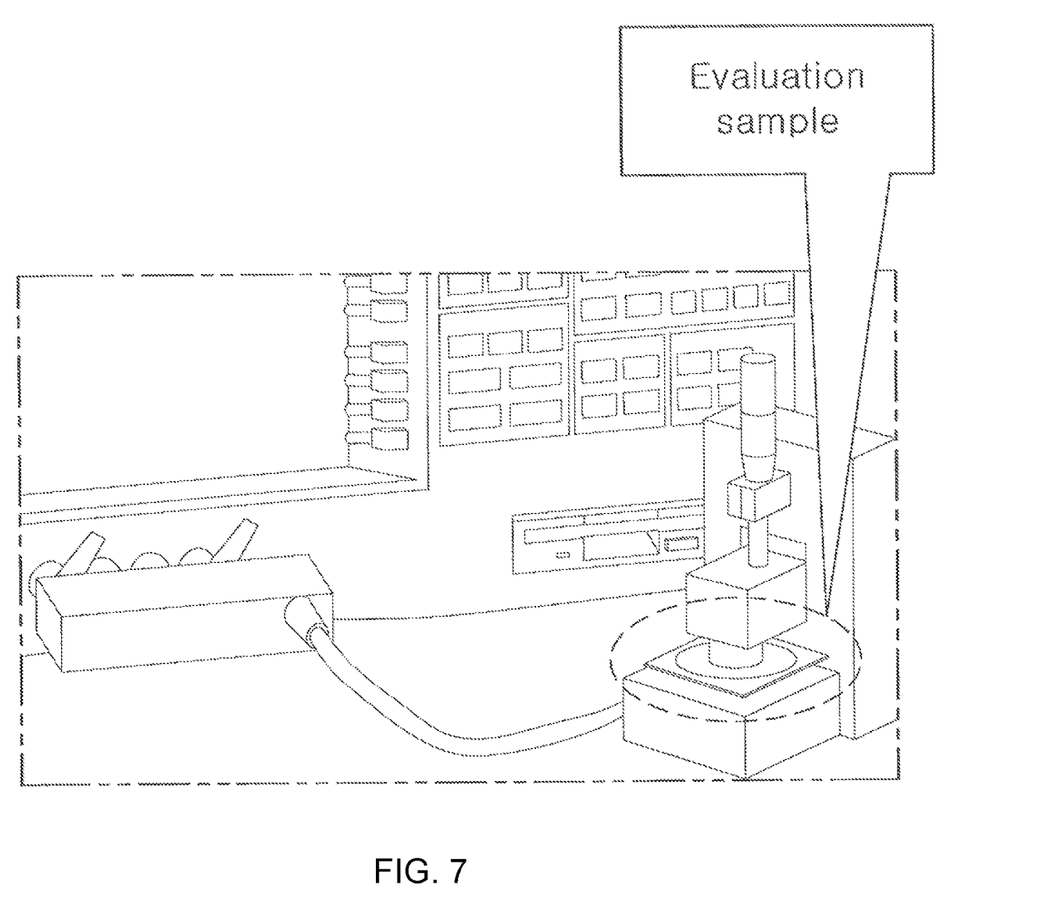
FIG. 7 is a photograph showing a device used to measure the permittivity of the adhesive films manufactured in Example 1 and Comparative Example 1.

The permittivity was measured by APRO R&D/KOLAS International Laboratory Accreditation Cooperation, and specifically, the adhesive film of each of Example 1 and Comparative Example 1 was cut to a size of 30 mm×30 mm, and a device for measuring permittivity was set so as to be suitable for evaluation conditions, as shown in FIG. 7, at a voltage of 1.0 V in the frequency ranges of 10 kHz, 100 kHz, 400 kHz and 1000 kHz, and the evaluation sample was fixed between electrodes using a jig, and the permittivity thereof was measured.

TABLE 1

| Classification | Frequency (kHz) | Dielectric constant (ε') | Dielectric loss (ε") | \|ε\| = ((ε')² + (ε")²)^{0.5} |
|---|---|---|---|---|
| Example 1 | 10 | 6.703 | 0.053 | 6.703 |
|  | 100 | 6.681 | 0.06 | 6.681 |
|  | 400 | 6.646 | 0.099 | 6.646 |
|  | 1000 | 6.68 | 0.24 | 6.684 |
| Comparative Example 1 | 10 | 5.489 | 1.383 | 5.660 |
|  | 100 | 5.254 | 1.324 | 5.418 |
|  | 400 | 5.253 | 1.36 | 5.426 |
|  | 1000 | 5.253 | 1.329 | 5.418 |

As is apparent from Table 1, the high-dielectric adhesive film of Example 1 exhibited superior permittivity at all frequencies compared to the adhesive film of Comparative Example 1.

The heat conductivity of the adhesive film of each of Example 1 and Comparative Example 1 was measured. The results are shown in Table 2 below and in FIGS. 8 and 9.

Figure 8:
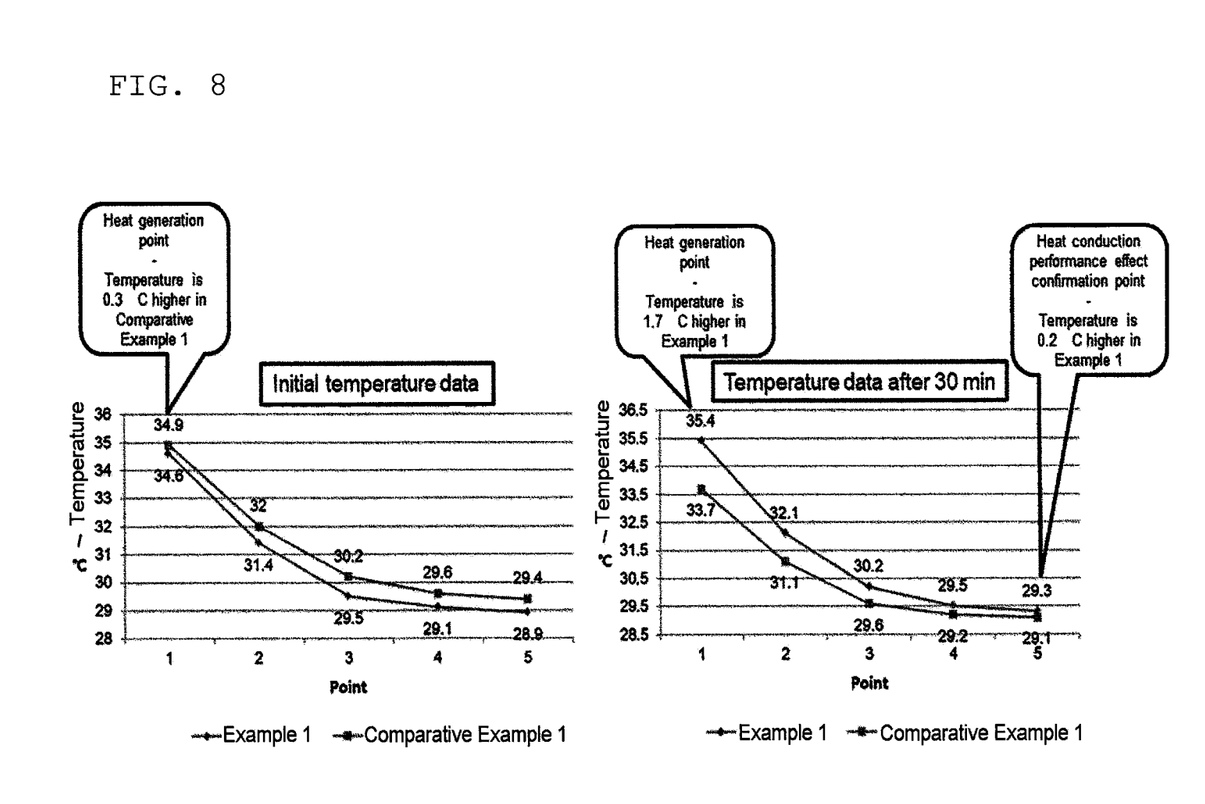
FIG. 8 is graphs showing the results of measurement of heat conductivity of the adhesive films manufactured in Example 1 and Comparative Example 1.
Figure 9:
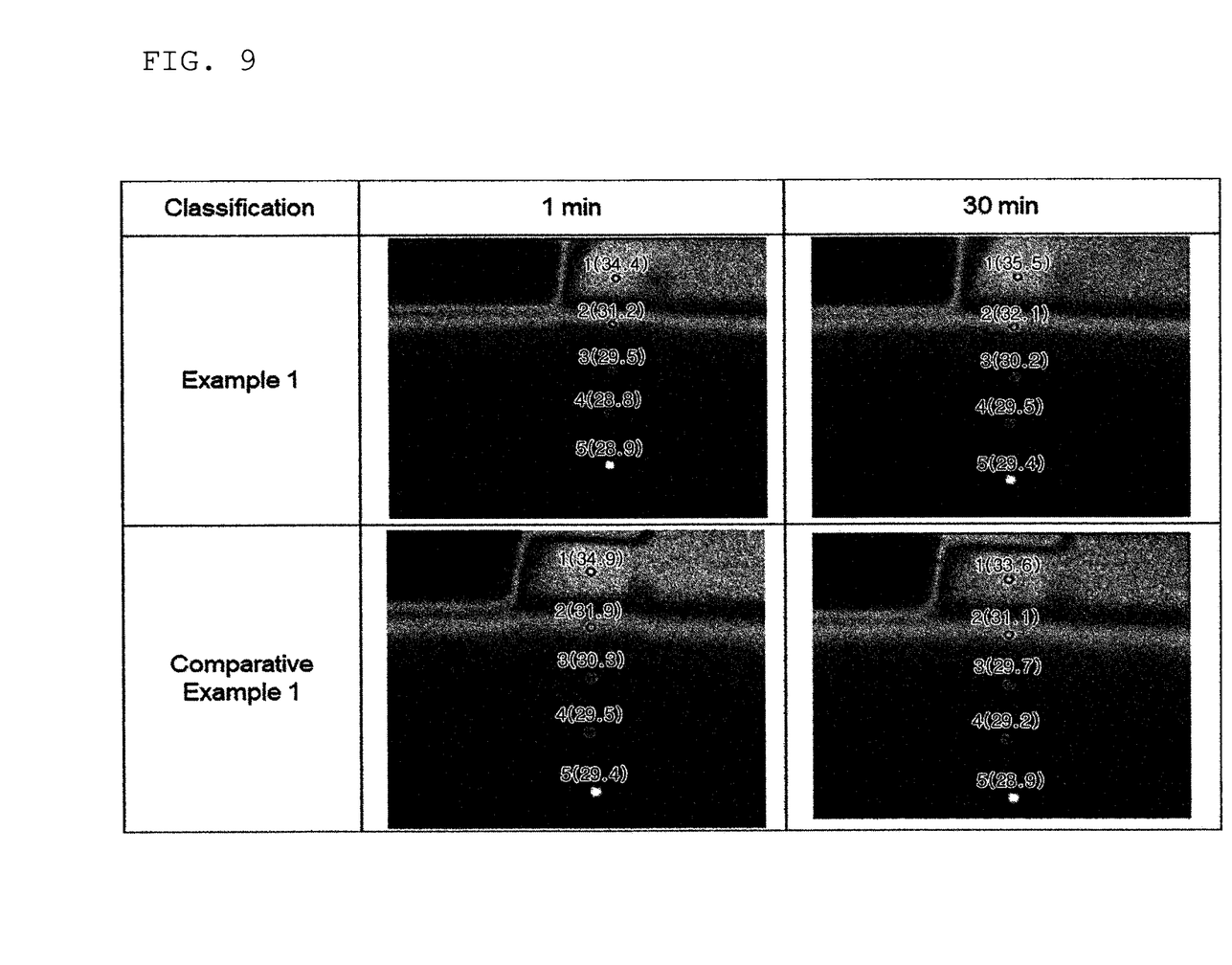
FIG. 9 is thermal imaging camera images showing the results of heat conductivity of the adhesive films manufactured in Example 1 and Comparative Example 1.

The heat conductivity was measured using a thermal imaging camera (R300SR), and specifically, the adhesive film of each of Example 1 and Comparative Example 1 was cut to a test sample having a size of 25 mm×100 mm, and a piece of black shading tape was attached to the test sample, heat at 50° C. was applied thereto, and the temperature was measured at 5 points using a thermal imaging camera for 1 to 30 min.

TABLE 2

| Classification | Initial temperature (° C.) | | | | | Temperature after 30 min (° C.) | | | | |
|---|---|---|---|---|---|---|---|---|---|---|
|  | 1POINT | 2POINT | 3POINT | 4POINT | 5POINT | 1POINT | 2POINT | 3POINT | 4POINT | 5POINT |
| Example 1 | 34.6 | 31.4 | 29.5 | 29.1 | 28.9 | 35.4 | 32.1 | 30.2 | 29.5 | 29.3 |
| Comparative Example 1 | 34.9 | 32 | 30.2 | 29.6 | 29.4 | 33.7 | 31.1 | 29.6 | 29.2 | 29.1 |

As is apparent from Table 2, the temperature of the adhesive film of Example 1 was low at heat generation points of the initial temperature, compared to the adhesive film of Comparative Example 1, but was elevated over time, indicating that the heat conductivity of the adhesive film of Example 1 was superior.

Therefore, the disclosed high-dielectric adhesive film is improved in permittivity due to the use of the ceramic component, thus preventing malfunction of the electronic device, increasing the stability and performance thereof, and exhibiting heat dissipation effects.

Although embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An adhesive film, comprising:
   a substrate layer;
   a ceramic-mixed layer formed on one or both surfaces of the substrate layer; and
   an adhesive layer formed on the surface of the substrate layer on which the ceramic-mixed layer is formed;
   wherein:
   the substrate layer has a thickness of 6 to 100 μm;
   the adhesive layer has a thickness of 5 to 100 μm;
   the ceramic-mixed layer includes 100 parts by weight of a ceramic and 50 to 200 parts by weight of silicone; and
   the ceramic includes at least one selected from the group consisting of aluminum oxide, silicon carbide, silicon nitride, zirconium oxide, chromium oxide and titanium dioxide.

2. The adhesive film of claim 1, wherein an adhesive layer is further formed on a surface of the substrate layer opposite the surface on which the ceramic-mixed layer is formed.

3. The adhesive film of claim 1, wherein the substrate layer comprises polyimide.

* * * * *